United States Patent
Sanders et al.

(10) Patent No.: US 7,532,695 B2
(45) Date of Patent: May 12, 2009

(54) CLOCK SIGNAL EXTRACTION DEVICE AND METHOD FOR EXTRACTING A CLOCK SIGNAL FROM DATA SIGNAL

(75) Inventors: Anthony Sanders, Haar (DE); Edoardo Prete, München (DE)

(73) Assignee: Infineon Technologies AG, München (DE)

( * ) Notice: Subject to any disclaimer, the term of this patent is extended or adjusted under 35 U.S.C. 154(b) by 540 days.

(21) Appl. No.: 10/530,852

(22) PCT Filed: Oct. 10, 2002

(86) PCT No.: PCT/EP02/11366

§ 371 (c)(1), (2), (4) Date: Apr. 11, 2005

(87) PCT Pub. No.: WO2004/034631

PCT Pub. Date: Apr. 22, 2004

(65) Prior Publication Data

US 2006/0023827 A1    Feb. 2, 2006

(51) Int. Cl.
*H03D 3/24* (2006.01)

(52) U.S. Cl. .................... 375/376; 375/354; 375/371; 375/373

(58) Field of Classification Search .................. 398/155
See application file for complete search history.

(56) References Cited

U.S. PATENT DOCUMENTS

| 4,713,802 | A | | 12/1987 | Kobata et al. | |
|---|---|---|---|---|---|
| 5,745,468 | A | * | 4/1998 | Nakano | 369/59.19 |
| 6,166,606 | A | | 12/2000 | Tsyrganovich | |
| 6,236,696 | B1 | * | 5/2001 | Aoki et al. | 375/376 |
| 6,307,906 | B1 | * | 10/2001 | Tanji et al. | 375/376 |

\* cited by examiner

*Primary Examiner*—Shuwang Liu
*Assistant Examiner*—Gina Mckie
(74) *Attorney, Agent, or Firm*—Maginot, Moore & Beck LLP

(57) ABSTRACT

A clock signal extraction device for extracting a clock signal from a periodic data signal includes a phase detector for detecting a first phase difference between rising edges of said data signal and a rising edges clock signal and for detecting a second phase difference between falling edges of said data signal and a falling edges clock signal. The device also includes a clock generator for generating said rising edges clock signal so that said first phase difference is minimized, for generating said falling edges clock signal so that said second phase difference is minimized, and for generating said clock signal in dependence on said first phase difference and said second phase difference. A method for extracting a clock signal from a periodic data signal is related to the device.

20 Claims, 3 Drawing Sheets

CLOCK SIGNAL EXTRACTION DEVICE AND METHOD FOR EXTRACTING A CLOCK SIGNAL FROM DATA SIGNAL

FIELD OF THE INVENTION

The present invention relates to the extraction of a clock signal and data from a data signal in a digital communication system, e.g. an optical data signal in an optical communication system. In particular, the invention relates to a clock signal extraction device and a method for extracting a clock signal from a data signal.

BACKGROUND

Serial communication systems require the extraction of a sampling clock from a serial stream, where the clock harmonic is not intrinsic in the signal itself. This extraction is performed by a non-linear circuit called a Clock and Data Recovery (CDR) unit. The CDR is responsible for tracking low frequency phase changes in the signal by observing the transitions of the signal and performing averaging.

FIG. 2 illustrates a typical clock and data recovery (CDR) circuit 200 for recovering a clock signal and data from a data signal using a phase-locked loop (PLL). The CDR circuit 200 comprises a phase detector 202 which generates up or down pulses whose durations are proportional to the phase error between the recovered clock signal and the data signal. Outputs of the phase detector 202 are connected to a phase pump (charge pump) 204. The phase pump 204 is connected by a loop filter 206 to a voltage-controlled oscillator (VCO) 208 for charging the voltage-controlled oscillator 208 either "up" or "down" by a control voltage. This allows phase corrections of the clock signal provided by the voltage-controlled oscillator 208. The clock signal of the voltage-controlled oscillator 208 is fed back to a clock input of the phase detector 202 forming the phase-locked loop. The clock signal or the recovered clock signal is also fed back to a clock input of a data sampler 210 for sampling the data signal at the rate of the recovered clock signal and for providing recovered data at a data output thereof. The recovered clock signal is a timing signal generated synchronous to the rate at which the original data pulses were transmitted from a transmitter in a communication system. The data sampler 210 preferably comprises a D-type flip-flop with a data input, a clock input and a data output. The phase detector preferably also comprises D-type flip-flops.

For example, in an optical communication system, a CDR is designed to find a mean phase of the transitions between low and high levels of an optical signal based on long-term averaging of the transitions. FIG. 3 shows an example of the superposition of transmitted data signals 302, 304 received at a receiver of the communication system and having ideal transition characteristics and undistorted amplitudes yielding to a perfect crossover of the signals. Broken curves 302', 304' further illustrate the effect of jitter 306 e.g. clock or phase jitter on the transition behaviour of the signals. For detecting the transition of a signal from a high state to a low state or vice versa, the transitions are sampled at a decision level in the middle of an eye formed by the superposed signals. The lower half of FIG. 3 shows the Probability Distribution Function (PDF) 308 of detected transitions of signals which are subjected to jitter. From this distribution, the mean transition value of the detected transitions is easily derived to obtain a mean sampling point for the sampling of data contained in a data signal.

However, in a long-haul optical communication system, signal distortion leads to an eye of the received data signal that is not optimal for a CDR. The distortion of the optical signals is caused e.g. by the optical dispersion of a transmission fibre and by the switch on/switch off behaviour of a transmitter like a laser.

FIG. 4 shows an example of the superposition of distorted optical signals 402, 404. The crossover of the falling and the rising edges of the signals is no longer positioned in the middle of a peak-to-peak amplitude of the eye, but towards the zero level of the optical signal. In such a case, the probability distribution function 408 of the detected transitions using a decision level in the middle of the eye comprises two peaks. Each peak is associated to the jittered transition of a falling edge and to the jittered transition of a rising edge of a signal, respectively. The jitter is shown at 406. It is readily visible that here the determination of a mean transition value is not possible. Rather, the distribution of the transitions leads to a dead zone, where the CDR is no longer able to find the mean transition value of the data signal. Since the sampling of the data from the data signal is based on a correct predict of the mean transition value, an unstable phase value will lead to a wrong sample of the data eye, thus leading to a degradation in the bit error rate of the link.

Usually, only averaging the transitions of either the rising or the falling edge of a signal solves this problem. Now that only a single edge is detected, the probability distribution function no longer has a dead zone and shows the same distribution as a signal, wherein the decision level is positioned at the crossover. However, this method suffers from a reduction in the amount of phase error information provided to a phase-locked loop. As stated above, a CDR must track low-frequency wander, and its ability to achieve this is a function of the amount of phase error information available. By only using one edge of the data, half the information available to the CDR is lost, thus leading to a degradation of the tracking ability and an increase in the bit error rate of a receiver.

FIG. 5 shows another usual solution of the above problem in which the decision level of the CDR is simply adjusted to be at the crossover of the superposed data signals 502, 504. However, this solution suffers from the reduced signal-to-noise ratio of the transition amplitude, leading to false detection of transitions and false tracking of the signal. The reduced signal-to-noise ratio (S/N) is caused by the fact that due to the distortion of the signals, the crossover of the signals lies close to the low signal level which is strongly subjected to noise.

SUMMARY

This object is achieved by a clock signal extraction device for extracting a clock signal from a periodic data signal and a method for extracting a clock signal from a periodic signal according to embodiments of the invention.

This object is achieved by a clock signal extraction device for extracting a clock signal from a periodic data signal according to claim 1 and a method for extracting a clock signal from a periodic data signal according to claim 11.

The basic idea of the invention is to use both edges of a data signal received at a receiver by individually averaging the probability distribution functions (see FIG. 4) of the rising and falling edges of the data signal using two independent phase-locked loops.

The invention relates to a clock signal extraction device for extracting a clock signal from a periodic data signal comprising a phase detector for detecting a first phase difference between rising edges of the data signal and a rising edges clock signal and for detecting a second phase difference between falling edges of the data signal and a falling edges clock signal; and a clock generator for generating the rising edges clock signal so that the first phase difference is minimized, for generating the falling edges clock signal so that the second phase difference is minimized, and for generating the clock signal in dependence on the first phase difference and the second phase difference.

The invention further relates to a method for extracting a clock signal from a periodic data signal, comprising detecting a first phase difference between rising edges of the data signal and a rising edges clock signal and detecting a second phase difference between falling edges of the data signal and a falling edges clock signal; and generating the rising edges clock signal so that the first phase difference is minimized, generating the falling edges clock signal so that the second phase difference is minimized, and generating the clock signal in dependence on the first phase difference and the second phase difference.

In the dependent claims advantageous developments and improvements of the device according to claim 1 and the method according to claim 11 are found.

According to a preferred development of the device according to the invention the clock generator generates the clock signal based on an average of the first phase difference and the second phase difference.

According to a further development of the device the clock generator comprises a first clock generator for generating the rising edges clock signal; a second clock generator for generating the falling edges clock signal; a third clock generator for generating the clock signal; and a controller for processing the first phase difference and the second phase difference and for controlling the first, second and third clock generator.

According to a further development of the device the phase detector comprises a first phase detector for detecting the first phase difference between the rising edges of the data signal and the rising edges clock signal; and a second phase detector for detecting the second phase difference between the falling edges of the data signal and the falling edges clock signal.

According to a further development of the device each of the first, second, and third clock generators comprises a voltage-controlled oscillator.

According to a further development of the device the controller comprises a phase pump and a loop filter.

According to a further development of the device the device is used in a data extraction device for extracting data from the data signal according to a rate of the clock signal.

According to a further development of the device the controller controls the clock generator for generating the clock signal such that the error rate of the extracted data is minimized.

According to a further development of the device the data extraction device comprises a data sampler for sampling the data signal.

According to a further development of the device the data sampler comprises a D-type flip-flop.

According to a development of the method according to the invention the step of generating comprises generating the clock signal based on an average of the first phase difference and the second phase difference.

According to a further development of the method the step of generating further comprises processing the first phase difference and the second phase difference; and generating and controlling the rising edges clock signal, the falling edges clock signal, and the clock signal.

According to a further development of the method the method further comprises extracting data from the data signal according to a rate of the clock signal.

According to a further development of the method the step of generating further comprises generating the clock signal such that the error rate of the extracted data is minimized.

According to a further development of the device and method according to the present invention the data signal is an optical data signal.

BRIEF DESCRIPTION OF THE DRAWINGS

Preferred embodiments of the present invention are shown in the accompanying drawings, in which.

DETAILED DESCRIPTION

Figure 1:
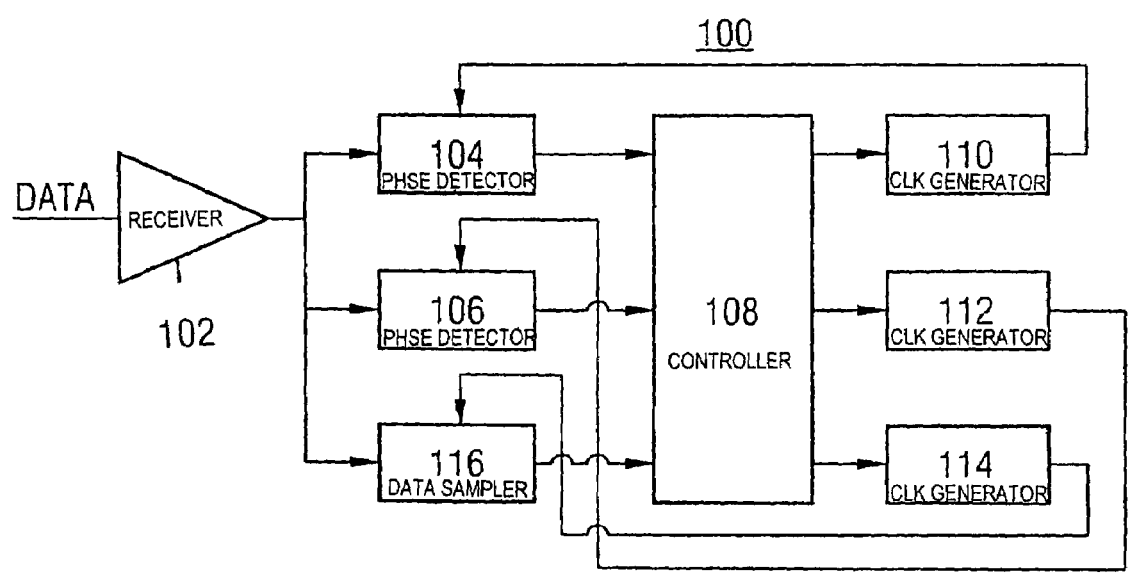
FIG. 1 shows a preferred embodiment of a device according to the invention.

FIG. 1 shows a data extraction device 100 for extracting data from a data signal according to a rate of an extracted clock signal. The data extraction device 100 comprises a preferred embodiment of a clock signal extraction device for extracting the clock signal from the periodic data signal according to the invention. The clock signal extraction device uses phase informations from a rising edge and a falling edge of the received data signal to generate tracking instructions provided to independent clock generators or phase generators.

The clock signal extraction device according to the invention comprises a receiver 102 for receiving a data signal received from a communication link of a communication system. The clock signal is preferably an optical baseband data signal received from an optical communication link, e.g. from an optical fibre of an optical communication system. The optical communication system is preferably a SONET (=Synchronous Optical NETwork) system.

The clock signal extraction device further comprises a first phase detector 104 and a second phase detector 106 connected with a respective input thereof to an output of the receiver 102, a controller 108 connected with respective inputs thereof to a respective output of the first phase detector 104 and the second phase detector 106, and a first clock generator 110, a second clock generator 112 and a third clock generator 114 connected with respective inputs thereof to respective outputs of the controller 108. The first clock generator 110 comprises an output connected to a further input of the first phase detector 104 forming a first loop. The second clock generator 112 comprises an output connected to a further input of the second phase detector 106 forming a second loop.

The first phase detector 104 detects a first phase difference between the transitions of rising edges or detection points of rising edges of the data signal and a rising edges clock signal generated by the first clock generator 110. The second phase detector 106 detects a second phase difference between the transitions of falling edges or detection points of falling edges of the data signal and a falling edges clock signal generated by the second clock generator 112. The first, second, and third clock generators 110, 112, and 114 preferably comprise a voltage-controlled oscillator (VCO).

The controller 108 processes the first phase difference provided by the first phase detector 104 and the second phase difference provided by the second phase detector 106 and controls the first clock generator 110 and the second clock generator 112 so that the first and second phase differences are minimized. Furthermore, the controller 108 controls the third clock generator 114 for generating an extracted clock signal in dependence on the first and second phase differences. The controller preferably controls the third clock generator in dependence on an average of the first phase difference and the second phase difference. The controller 108 preferably comprises a phase pump and a loop filter associated to each first, second and third clock generator 110, 112 and 114.

Further to the clock signal extraction device the data extraction device 100 comprises a data sampler 116 connected to the output of the receiver 102, to an output of the third clock generator 114 for receiving the extracted clock signal, and to a further input of the controller 108. The data sampler 116 preferably comprises a D-type flip-flop controlled by the extracted clock signal for sampling the data signal and extracting the data accordingly.

In another embodiment of the invention, the controller 108 further controls the third clock generator in dependence on a phase difference supplied to the controller 108 by the data sampler 116. In a even further embodiment of the invention, the controller 108 controls the third clock generator 114 such that the error rate of the extracted data is minimized.

In a method according to the present invention, a clock signal is extracted from a periodic data signal. In a first step of the method, a first phase difference between rising edges of a data signal and a rising edges clock signal is detected and a second phase difference between falling edges of a data signal and a falling clock signal is detected. In a second step of the method, the rising edges clock signal is generated such that the first phase difference is minimized, and the falling edges clock signal is generated such that the second phase difference is minimized, and the clock signal is generated in dependence on the first phase difference and the second phase difference. The clock signals are preferably generated based on an average of the first phase difference and the second phase difference. In a further step of the invention, data is extracted from a data signal according to a rate of the extracted clock signal. The clock signal is preferably generated such that the error rate of the extracted data is minimized. The method of the invention is preferably implemented in a digital signal processor (DSP).

One advantage of the present invention is that by individually finding the mean transition value of a data signal, there is no longer any dead zone. The individual mean transition values of the rising and falling edges of the data signal can be used to define the ideal sampling point of a received data eye such that the data samples have the lowest possible error rate.

List of Reference Signs

Figure 2:
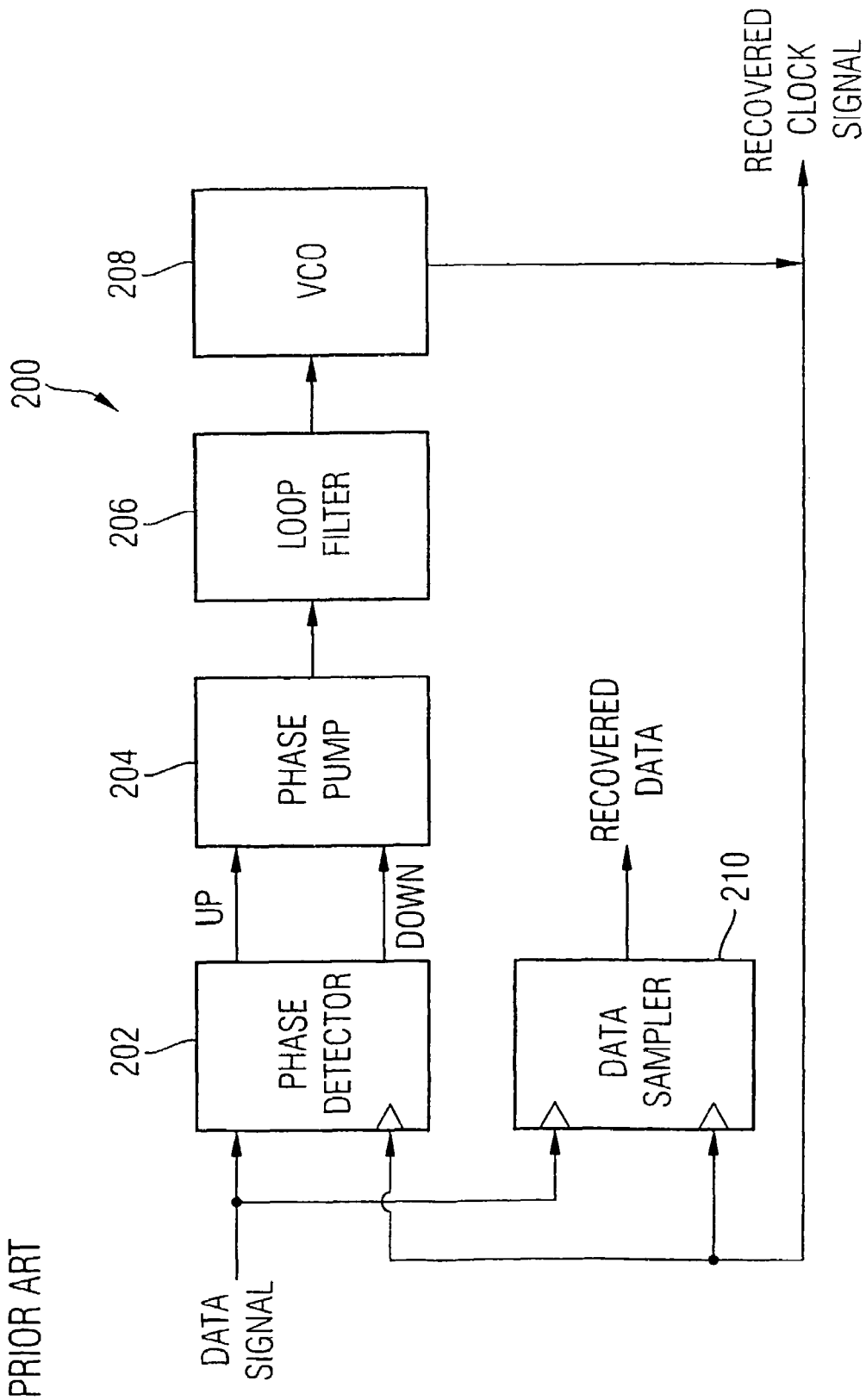
FIG. 2 shows a typical clock and data recovery circuit.
Figure 3:
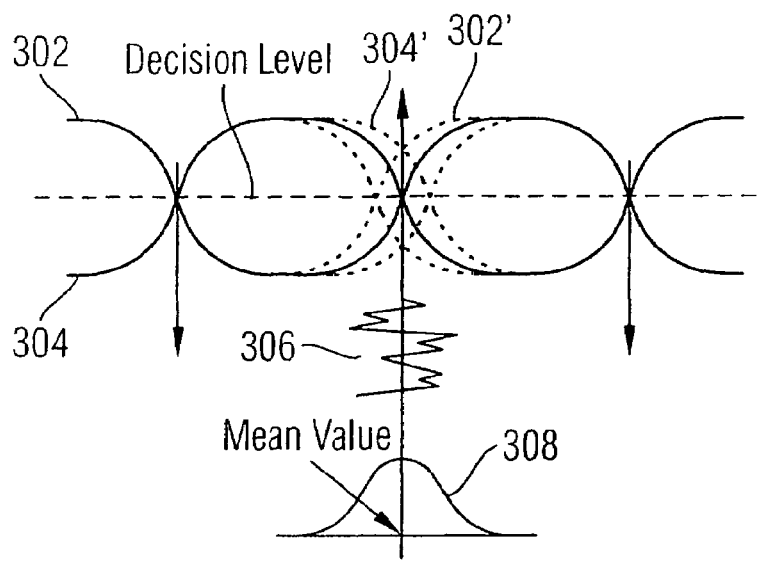
FIG. 3 depicts a superposition of received signals having ideal transition characteristics in a communications system.
Figure 4:
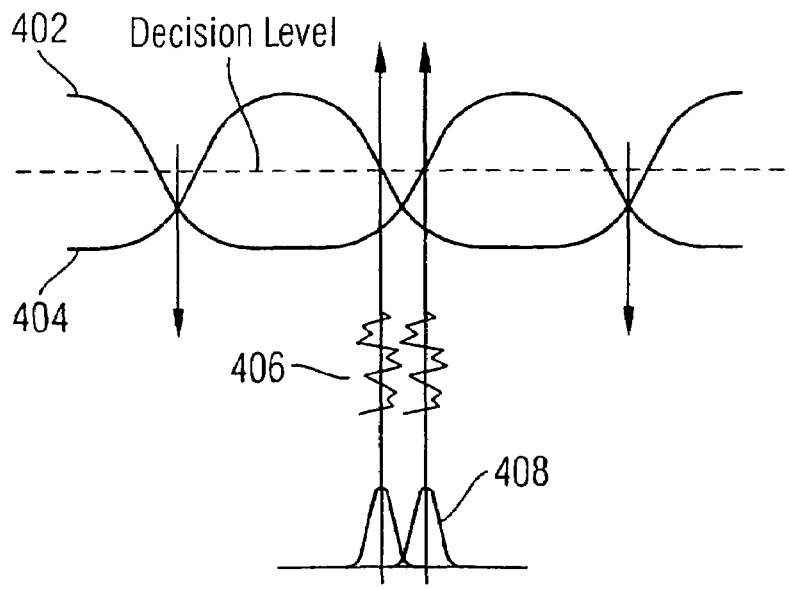
FIG. 4 depicts a superposition of distorted received signals in an optical communications system.
Figure 5:
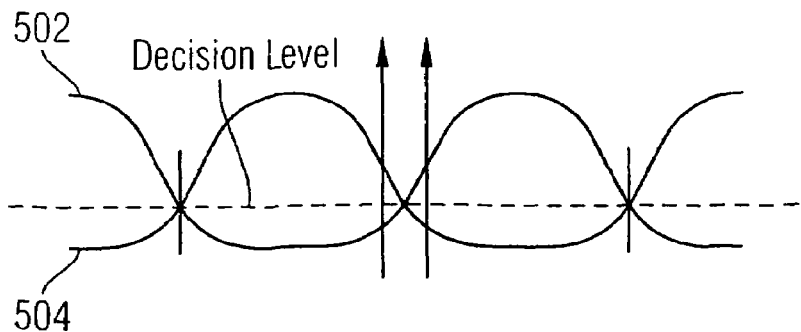
FIG. 5 depicts a superposition of distorted received signals using a decision level at signal crossover for transition detection.

FIG. 1
100 data extraction device
102 receiver
104 first phase detector
106 second phase detector
108 controller
110 first clock generator
112 second clock generator
114 third clock generator
116 data sampler FIG. 2
200 clock and data recovery circuit
202 phase detector
204 phase pump
206 loop filter
208 voltage-controlled oscillator
210 data sampler

The invention claimed is:

1. A clock signal extraction device for extracting an extracted clock signal out of a periodic data signal, comprising:
a first clock generator circuit configured to generate a rising edge clock signal, the first clock generator circuit having a first output;
a first phase detector configured to detect a first phase difference between a rising edge of the periodic data signal and a rising edge of the rising edge clock signal, the first phase detector having a first input connected to the first output to form a first loop, and wherein the first clock generator circuit and the first phase detector cooperate to reduce the detected first phase difference,
a second clock generator circuit configured to generate a falling edge clock signal, the second clock generator circuit having a second output;
a second phase detector configured to detect a second phase difference between a falling edge of the periodic data signal and a falling edge of the falling edge clock signal, the second phase generator having a second input connected to the second output to form a second loop, and wherein the second clock generator circuit and the second phase detector cooperate to reduce the detected second phase difference;
a third clock generator circuit configured to generate the extracted clock signal and;
a controller comprising a phase pump and a loop filter configured to control the third clock generator circuit based on an average of the first phase difference and the second phase difference.

2. The clock signal extraction device according to claim 1, wherein the controller is configured to process said first phase difference and said second phase difference to control generation of the extracted clock signal by the third clock generator circuit.

3. The clock signal extraction device according to claim 2, wherein the controller further constitutes a part of the first clock generator circuit and the second clock generator circuit.

4. The clock signal extraction device according to claim 3, wherein each of said first, second and third clock generator circuits includes a voltage controlled oscillator.

5. The clock signal extraction device according to claim 1, wherein each of said first, second and third clock generator circuits includes a voltage controlled oscillator.

6. The clock signal extraction device according to claim 1, wherein each of the first, second and third clock generator circuits includes a phase pump and a loop filter.

7. The clock signal extraction device according to claim 3, wherein the controller further comprises, for each of the first, second and third clock generator circuits, a phase pump and a loop filter.

8. An arrangement for extracting data, including:
a clock signal extraction device for extracting an extracted clock signal out of a periodic data signal, comprising
a first clock generator circuit configured to generate a rising edge clock signal, the first clock generator circuit having a first output,
a first phase detector configured to detect a first phase difference between a rising edge of the periodic data signal and a rising edge of the rising edge clock signal, the first phase detector having a first input connected to the first output to form a first loop, and wherein the first clock generator circuit and the first phase detector cooperate to reduce the detected first phase difference, a second clock generator circuit configured to generate a falling edge clock signal, the second clock generator circuit having a second output;

a second phase detector configured to detect a second phase difference between a falling edge of the periodic data signal and a falling edge of the falling edge clock signal, the second phase generator having a second input connected to the second output to form a second loop, and wherein the second clock generator circuit and the second phase detector cooperate to reduce the detected second phase difference, a third clock generator circuit configured to generate the extracted clock signal and a controller comprising a phase pump and a loop filter configured to control the third clock generator circuit based on an average of the first phase difference and the second phase difference; and a data extraction device configured to extract data from said periodic data signal according to a rate of said extracted clock signal.

9. The arrangement according to claim 8, wherein the controller is configured to process said first phase difference and said second phase difference to control generation of the extracted clock signal by the third clock generator circuit.

10. The arrangement according to claim 9, wherein said controller controls said third clock generator periodic to generate said clock signal such that the error rate of the extracted data is minimized.

11. The arrangement according to claim 8, wherein said data extraction device comprises a data sampler for sampling said circuit data signal.

12. The arrangement according to claim 11, wherein said data sampler comprises a D-type flip-flop.

13. A method for extracting an extracted clock signal out of a periodic data signal, comprising:
(a1) generating a rising edge clock signal;
(a2) detecting a first phase difference between a rising edge of the periodic data signal and the rising edge of a rising edge clock signal;
(a3) feeding back the first phase difference to generate a subsequent rising edge clock signal having a reduced first phase difference;
(b1) generating a falling edge clock signal;
(b2) detecting a second phase difference between a falling edge of the periodic data signal and a falling edge of the falling edge clock signal;
(b3) feeding back the second phase difference to generate a subsequent falling edge clock signal having a reduced second phase difference; and
(c) generating the extracted clock signal and controlling the extracted clock signal based on an average of a of the first phase difference and the second phase difference way using a phase pump and a loop filter.

14. The method according to claim 13, where step (a1) includes employing a voltage controlled oscillator to generate the first clock signal and the subsequent first clock signal.

15. The method according to claim 14, where step (a2) includes employing a voltage controlled oscillator to generate the second clock signal and the subsequent second clock signal.

16. The method according to claim 13, further comprising a step of: extracting data from said periodic data signal according to a rate of said extracted clock signal.

17. The method according to claim 16, wherein step c) further comprises generating the extracted clock signal such that the error rate of said extracted data is minimized.

18. The method according to claim 17, wherein said periodic data signal is an optical periodic data signal.

19. The method according to claim 17, further comprising extracting data from said periodic data signal using a flip-flop.

20. The method according to claim 13, wherein said periodic data signal is an optical periodic data signal.

* * * * *